United States Patent
Pulici et al.

(10) Patent No.: US 7,750,690 B2
(45) Date of Patent: Jul. 6, 2010

(54) OUTPUT STAGE FOR ELECTRONIC DEVICES INTEGRATED ON A SEMICONDUCTOR SUBSTRATE, IN PARTICULAR FOR HIGH FREQUENCY APPLICATIONS AND CORRESPONDING METHOD

(75) Inventors: Paolo Pulici, Legnano (IT); Michele Bartolini, Melegnano (IT); Pier Paolo Stoppino, Milan (IT)

(73) Assignees: STMicroelectronics S.R.L., Agrate Brianza, MI (IT); Politecnico di Milano, Milan (IT)

( * ) Notice: Subject to any disclaimer, the term of this patent is extended or adjusted under 35 U.S.C. 154(b) by 126 days.

(21) Appl. No.: 11/972,234

(22) Filed: Jan. 10, 2008

(65) Prior Publication Data
US 2008/0174363 A1  Jul. 24, 2008

(30) Foreign Application Priority Data
Jan. 24, 2007  (IT)  ............................ MI2007A0098

(51) Int. Cl.
*H03B 1/00* (2006.01)
*H03K 3/00* (2006.01)
(52) U.S. Cl. .................... 327/112; 327/67; 327/108; 327/109; 327/110; 327/111
(58) Field of Classification Search .................. 327/67, 327/112
See application file for complete search history.

(56) References Cited

U.S. PATENT DOCUMENTS 7,126,385 B2 * 10/2006 Brekelmans et al. ........... 327/67
2003/0058006 A1 * 3/2003 Srikanth et al. ............. 327/108

* cited by examiner

*Primary Examiner*—Lincoln Donovan
*Assistant Examiner*—John W Poos
(74) *Attorney, Agent, or Firm*—Lisa K. Jorgenson; Allen, Dyer, Doppelt, Milbrath & Gilchrist, P.A.

(57) ABSTRACT

An output stage may include an input terminal receiving an input signal, an output terminal coupled to an external load, and a pre-buffer coupled to the input terminal and including an enable terminal receiving a general enable signal and a first output terminal for supplying a first control signal. The output stage may also include an output buffer including a first final transistor inserted between the supply terminal and the output terminal, and a control terminal coupled to the first output terminal of the pre-buffer for receiving the first control signal, and a first tracking circuit between the supply terminal and the first output terminal of the pre-buffer. The first tracking circuit may include a first capacitor between the supply terminal and a first intermediate node coupled to the first output terminal of the pre-buffer by a switch activated by a first activation signal during a transient of the first final transistor thereby reconstructing a noise of the first reference voltage.

17 Claims, 6 Drawing Sheets

OUTPUT STAGE FOR ELECTRONIC DEVICES INTEGRATED ON A SEMICONDUCTOR SUBSTRATE, IN PARTICULAR FOR HIGH FREQUENCY APPLICATIONS AND CORRESPONDING METHOD

FIELD OF THE INVENTION

The present invention relates to an output stage for electronic circuits, in particular, for high frequency applications and a related method.

BACKGROUND OF THE INVENTION

As known to the skilled person in the art, applications using electronic circuits integrated on a semiconductor substrate and being able to transmit data at high frequencies are widespread. Electronic circuits integrated on semiconductor, also called chips, are assembled in a package, which comprises a casing of thermosetting resin and incorporates a support frame with electric connection pins. The electronic circuit itself is tied to this frame.

The assembling technology has undergone, in recent times, a development that allows realization of multi-chip systems by overlapping more chips in a same package to form a pile, also called stack. In multi chip systems, there has been the frequent integration of nonvolatile memories, in particular, of the Flash type, with volatile memories, mainly of the DRAM and PSRAM type. These systems are particularly used in cell devices and in wireless applications.

There is need to make the Flash memories compatible with transmission frequencies of volatile memories data. As known to the skilled person in the art, the increase of data transmission frequencies implies an increase in the "noise" on the supplies in the electronic circuit involved in the transmission. The "noise" is linked to a variation of the reference voltages during the transmission of data in the circuit, as well as, to a variation of the output current. This "noise" particularly implies a reduction and a deterioration of the performances of the electronic circuit with an increase of time necessary for the data transmission.

Figures 1, 4, 5:
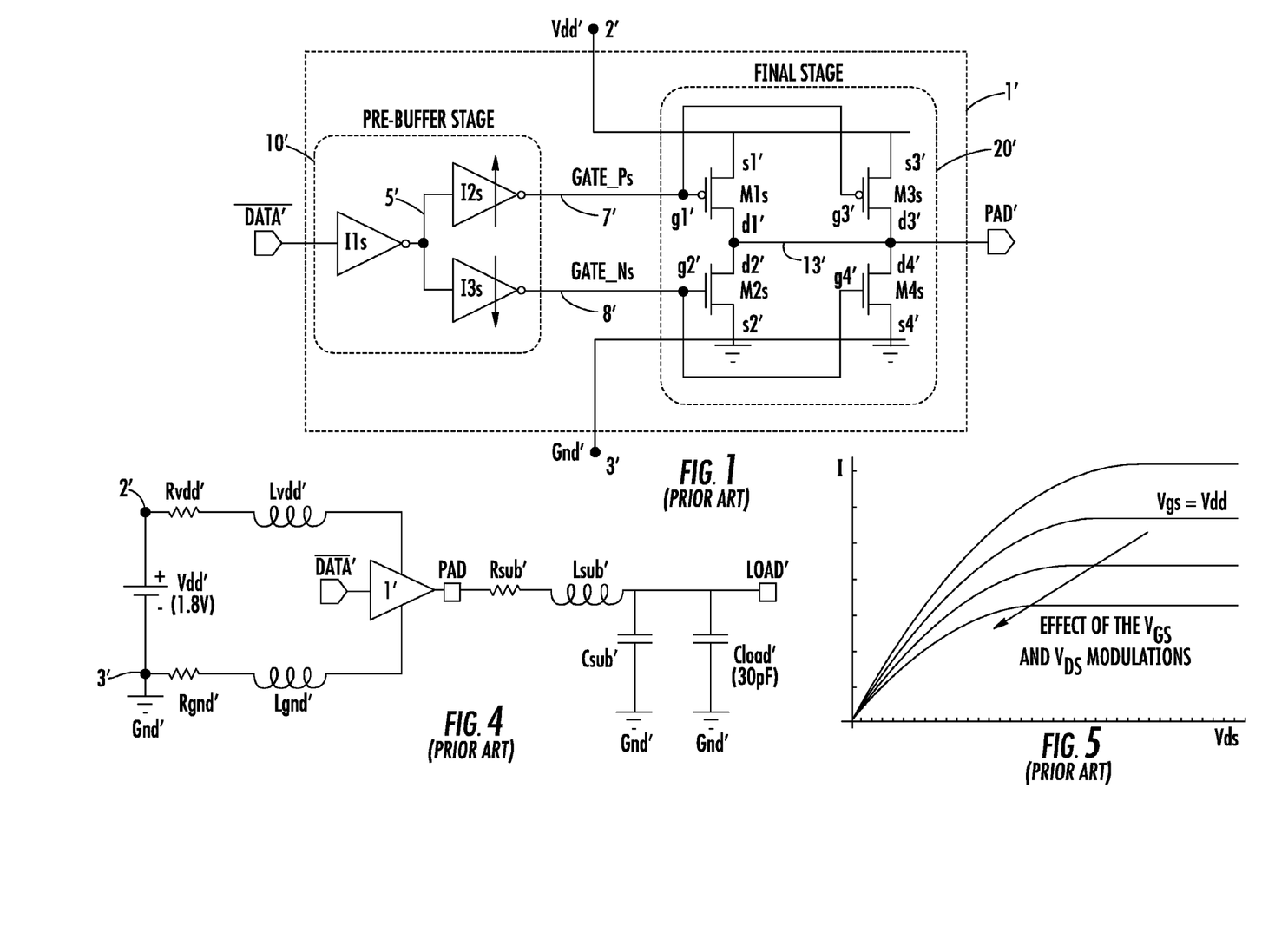
FIGS. 1 and 2 schematically and respectively show a first and a second output stage, according to the prior art.
FIG. 4 schematically illustrates a pattern with concentrated parameters of an output stage, according to the prior art.
FIG. 5 shows operation curves characteristic of a transistor of the MOS type, according to the prior art.

FIG. 1 schematically illustrates an output stage 1' realized according to the prior art. The output stage 1' is inserted between a supply terminal 2' receiving a first reference voltage Vdd' or supply voltage, and a reference terminal 3' maintained at a second reference voltage Gnd or ground. The output stage 1' also has a first input terminal DATA' and an output terminal PAD' connected to an external load (not shown). In particular, the output stage 1' comprises a prebuffer 10' connected to the input terminal DATA' connected in turn to a final buffer 20' in correspondence with a first 7' and a second output terminal 8' of the pre-buffer 10'.

The pre-buffer 10' comprises a first inverter I1s, which receives a signal from the input terminal DATA' and is connected, in correspondence with a single terminal 5', to a second inverter I2s and to a third inverter I3 respectively connected to the first 7' and to the second output terminal 8'. In this way, at the first output terminal 7', there is a first signal GATE_PS, which substantially corresponds to a second signal GATE_NS present at the second output terminal 8'.

The output buffer 20' comprises a first complementary pair of transistors, M1s and M2s, connected to each other to form a first output terminal 13', connected in turn to the output terminal PAD'. In particular, the transistor M1s is a p-MOS transistor and is connected with the source terminal s1' to the supply terminal 21 and with a gate terminal g1' to the first output terminal 7' of the pre-buffer 10'. Instead, the transistor M2s is connected with a source terminal s2' to the reference terminal 3' and with a gate terminal g2' to the second output terminal 8' of the pre-buffer 10'.

The output buffer 20' further comprises a second complementary pair of transistors M3s and M4s, substantially corresponding and connected in parallel to the first complementary pair of transistors M1s and M2s. In particular, the second complementary pair of transistors M3s and M4s is inserted with source terminals s3' and s4' respectively connected to the supply terminal 2' and to the reference terminal 3'. Gate terminals g3' and g4' are connected to the first and to the second output terminal 7' and 8' of the pre-buffer 10', and the drain terminals d3' and d4' are connected to each other and connected to the first output terminal 13' to form the output terminal PAD' of the output stage 1'

In this way, the pre-buffer 10' drives separately by way of the first signal GATE_Ps and the second signal GATE_Ns the transistors p and n, M1s, M3s and M2s, M4s, respectively, of the output buffer 20', so as to reduce any possible cross conduction current between the same transistors p and n during the switch of a signal present in the output terminal PAD' due to a switch of the signal in the input terminal DATA'.

As it is known to the skilled person in the art, the output stages are realized in a substantially symmetrical way and comprise a first section for the driving of an output or final transistor p. For example, in FIG. 1, the transistor M1s and M3s and a second section for the driving of an output or final transistor n, and the transistor M2s and M4s. Such sections operate in a substantially alternated way on the basis of the switch of the signal in the input terminal DATA' from high to low or vice versa from low to high.

Figures 2, 3:
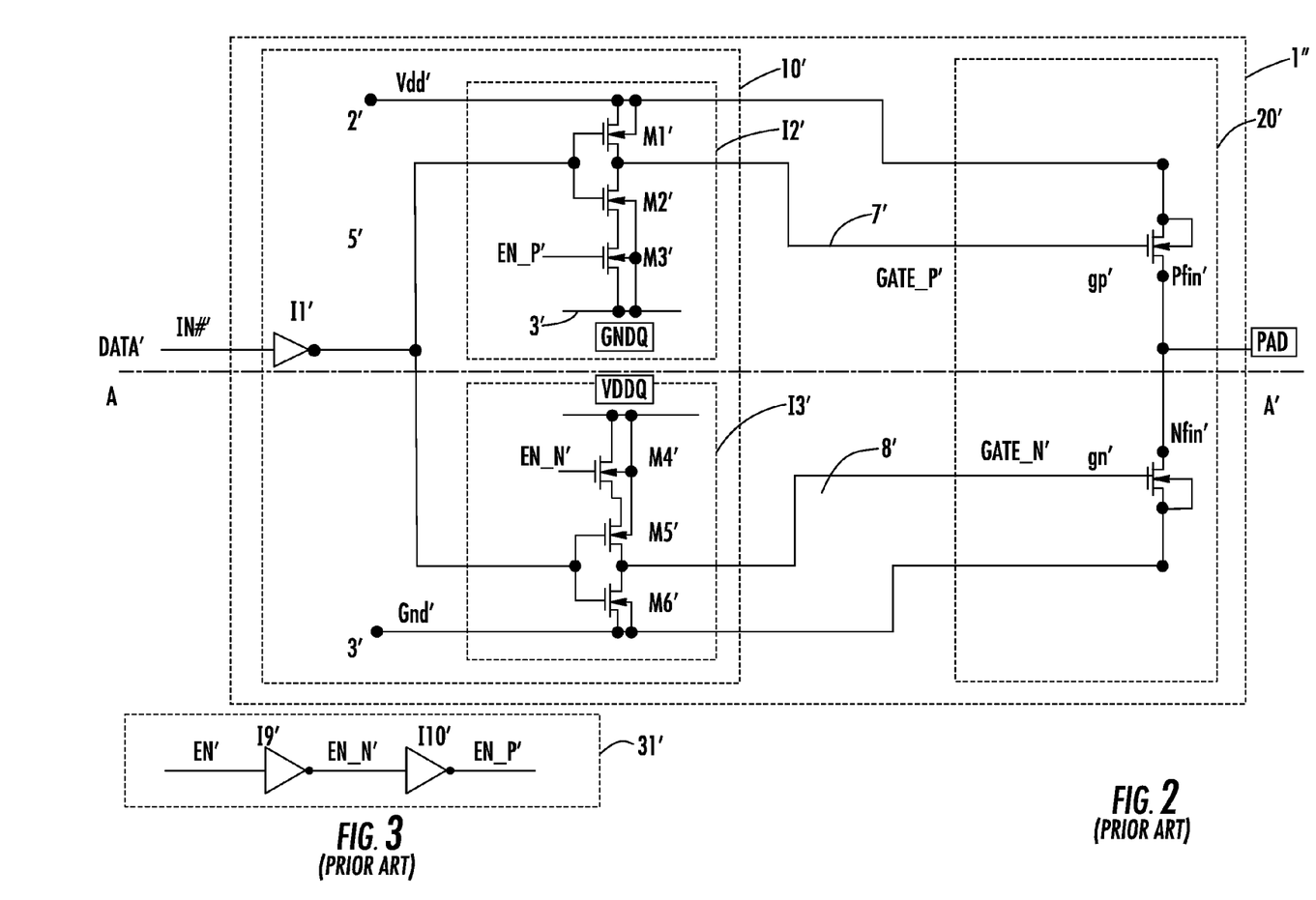
FIG. 3 shows an enable circuit for the output stage of FIG. 2, according to the prior art.

FIG. 2 schematically illustrates a second prior art embodiment of an output stage, globally indicated with 1". Elements structurally and functionally corresponding to the output stage 1' previously described and shown in FIG. 1 may be given the same reference numbers by way of illustration. Also in this embodiment, the output stage 1" comprises a pre-buffer 10' connected to an input terminal DATA' and connected, in correspondence with a first 7' and a second output terminal 8', to a final buffer 20'.

The output stage 1" is substantially symmetrical with respect to an intermediate line A-A' then, by way of clarity and simplicity, the description of a part of the output stage 1", in particular, the one above the line A-A' may follow the description of the remaining part of the stage 1" being logically deducible. The pre-buffer 10' comprises an inverter I1' connected to the input terminal DATA' and connected in turn to a second inverter I2' in correspondence with an output terminal 5'.

The second inverter I2' comprises a complementary pair of MOS transistors, in particular, a first p-MOS transistor M1' and a second n-MOS transistor M2', inserted with respective source terminals between the supply terminal 2' and the reference terminal 3' Respective drain terminals are connected to each other to form the output terminal 7', and the respective gate terminals are connected to the output terminal 5' of the first inverter I1'. Moreover, the second transistor M2' is connected to the reference terminal 3' by way of the interposition of a third transistor M3' of the n-MOS type, connected thereto in series, which has a gate terminal driven by a first enable signal EN_P'.

In particular, as shown in FIG. 3, the first enable signal EN_P' is supplied by a logic circuit 31' outside the pre-buffer 10'. The logic circuit 31' comprises a first inverter I9' and a second inverter I10' connected in series. The first inverter I9' receives a general enable signal EN' of the electronic circuit and supplies the output terminal with a second complementary enable signal EN_N'. The second inverter I10', which receives the second complementary enable signal EN_N' at its input terminal, supplies the respective output terminal with the first enable signal EN_P' which substantially corresponds to the general enable signal EN' delayed by the inverters I9' and I10'.

The second inverter I2' of the pre-buffer 10' is enabled by the first enable signal EN_P' and supplies a first signal Gate_P' at the output terminal 7' suitable for driving the output buffer 20'. The output buffer 20' comprises a first final transistor Pfin' of the pMOS type, which shows a gate terminal gp' connected to the output terminal 7' of the pre-buffer 10', a source terminal connected to the supply terminal 2', and a drain terminal connected to the output terminal PAD' of the output stage 1".

Symmetrically, the pre-buffer 10' comprises a third inverter I3' interposed between the reference terminal 3' and the supply terminal 2', being enabled by the second enable signal EN_N' supplied by the logic circuit 31'. This supplies a second signal Gate_N' at a second output terminal S' suitable for driving a second final transistor Nfin', of the n_MOS type, inserted between the output terminal PAD' of the output buffer 20' and the reference terminal 3'. In particular, the first signal Gate_P' and the second signal Gate_N' are substantially corresponding and alternatively drive the first final transistor Pfin' and the second final transistor Nin' of the output buffer 20'.

As known to the skilled person in the art, an electronic circuit as well as the corresponding output stage are connected to the external components through the package interconnections. Therefore, the electric signals present on the interconnection pins connected to reference voltages, in particular, to the first reference voltage present at the supply terminal and to the second reference voltage present at the reference terminal, are not ideal but suffer from the parasite effect of the interconnection lines and of the package.

FIG. 4 schematically shows a pattern with concentrated parameters of an output stage, similar to the one represented in FIGS. 1-3, with connections to the reference voltages, in particular, to the first reference voltage Vdd' in correspondence with the supply terminal 2' and to the second reference voltage Gnd' in correspondence with the reference terminal 3'. The output stage, always indicated with 1', is connected between an input terminal DATA' and an output terminal PAD'.

In particular, the pattern shown comprises a first resistance Rvdd' and a first inductance Lvdd', both parasitic and proper of the interconnection line to the supply terminal 2', as well as a second resistance Rgnd' and a second inductance Lgnd', both parasitic and proper of the interconnection line to the reference terminal 3'.

Moreover, the real interaction between the output stage 1' and a semiconductor substrate where the circuit is realized is shown by way of a parasite network RLC'. The network RLC' comprises a third resistance Rsub' in series to a third inductance Lsub' interposed between the output terminal PAD' and the load LOAD', as well as a first capacitor Csub' interposed between the load LOAD' and the second reference voltage Gnd'. Finally, the pattern of a second capacitor Cload' or load capacitor is shown connected in parallel to the first capacitor Csub'

During a switch of the logic value present in correspondence with the output terminal PAD' r there is a breakdown of the first reference voltage Vdd' or of the second reference voltage Gnd' according to the transition in progress. In consequence, there is a variation of the driving voltage of the output stage 1', i.e. of the load voltage Load'. In particular, according to the transition, a current flows from or towards the load capacitor Cload' and moreover, the first Lvdd', the second Lgnd' and the third Lsub' inductance induce an inductive parasitic contribution, which implies a reduction of the voltage at the output terminal PAD'.

Considering, for example, a switch of the output signal present at the output terminal PAD' with a rising transition, for example, from a logic value 0 to a logic value 1 according to the scheme of FIG. 2, the first final transistor Pfin' of the final buffer 20' may be brought in conduction. However, the parasitic elements and, in particular, the load capacitor Cload' require a current which inevitably induces, at least on a first transient, an oscillation of the output voltage with a reduction of the first reference voltage Vdd' at the supply terminal 2'.

This effect reflects on the drain-source voltage difference Vds of the first final transistor Pfin' of the output buffer 20', which implies, besides a reduction of the voltage at the output terminal PAD', also a reduction of the corresponding current value. FIG. 5 reports the known curves characteristic of a MOS transistor. As depicted, it can be observed how the first final transistor Pfin' of the output buffer 20' operates, at least during a transient of the output stage 1', with characteristics comprising an underlying curve and an ideal curve characterized by a gate-source voltage difference Vgs equal to the first reference voltage Vdd'.

In other words, the output stage 1' realized according to the prior art, under real situations, shows an operation below the ideal condition of the transistors therein due to the parasitic elements always present in a real circuit, which cause undesired variations of the reference voltages with subsequent loss in terms of performances an speed. A possible problem is devising an output stage that is not affected by the oscillations of the reference voltages connected thereto during the high frequency operation by using a simple and functional architecture, so as to overcome the limits or drawbacks still affecting the output stages realized according to the prior art.

SUMMARY OF THE INVENTION

An approach is that of driving the transistor in conduction with the output buffer with a voltage that replicates the same oscillations present on the reference voltage. These oscillations are followed to assist operation of the transistor in conduction in its near ideal conditions.

On the basis of this approach, the technical problem is addressed by an output stage for electronic circuits integrated on a semiconductor substrate inserted between a supply terminal, receiving a first reference voltage, and a reference terminal, maintained at a second reference voltage, and having at least one input terminal, receiving an input signal, and an output terminal connected to an external load. The output stage comprises a pre-buffer connected to the input terminal and having an enable terminal receiving a general enable signal and at least one first output terminal suitable for supplying a first control signal. The output stage may also include an output buffer comprising at least one first final transistor inserted between the supply terminal and the output terminal and having a control terminal connected to the first output terminal of the pre-buffer and receiving therefrom the first control signal.

Advantageously, the output stage may also include at least one first tracking circuit inserted between the supply terminal and the first output terminal of the pre-buffer and having a first capacitor inserted between the supply terminal and a first intermediate node which is in turn connected to the first output terminal of the pre-buffer by way of a switch activated by a first activation signal during at least one transient of the first final transistor, thus reconstructing a noise present on the first supply voltage.

A method is provided for driving an output stage as previously described, which further comprises a switch of the input signal. The method may include a first activation step suitable for activating at least one first final transistor of the output buffer, generating a corresponding first control signal at the first output terminal of the pre-buffer, and a second reconstruction step suitable, at least in a transient, for replicating the first supply voltage present in the supply terminal in the control terminal of the first final transistor reconstructing a noise present on the first supply voltage.

BRIEF DESCRIPTION OF THE DRAWINGS

The characteristics and the advantages of the output stage and of the driving method according to the present invention may be apparent from the following description of embodiments given by way of indicative and nonlimiting example with reference to the annexed drawings.

DETAILED DESCRIPTION OF THE PREFERRED EMBODIMENTS

Figure 6:
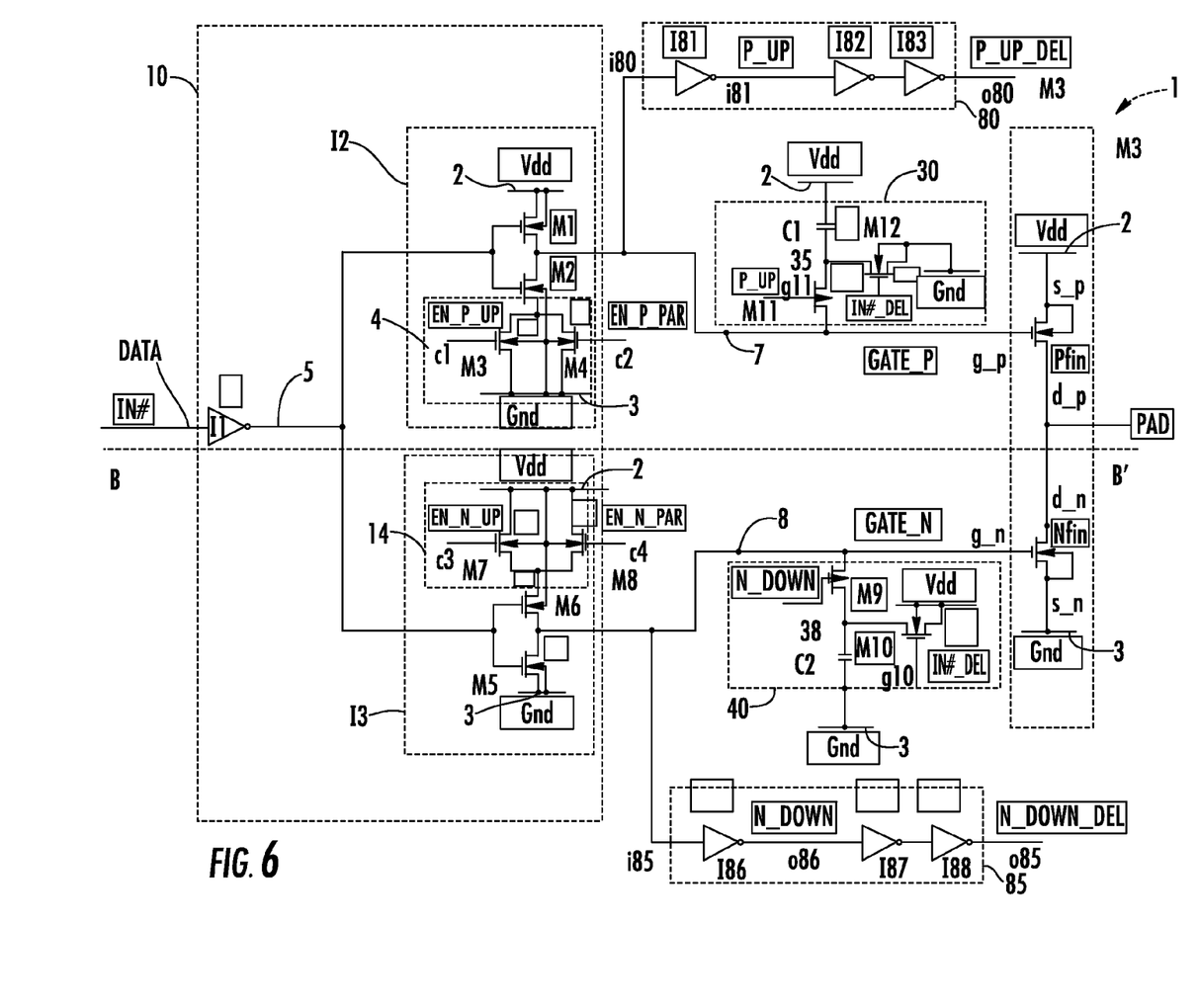
FIGS. 6 and 6A-6D schematically show an output stage according to the present invention as well as respective auxiliary circuits.

With reference to FIG. 6, 1 schematically indicates an output stage for electronic circuits integrated on a semiconductor substrate. The output stage 1 is inserted between a supply terminal 2, receiving a first reference voltage Vdd, in particular, a supply voltage, and a reference terminal 3, maintained at a second reference voltage Gnd, in particular, a ground. Moreover, the output stage 1 has an input terminal DATA, which receives an input signal IN# and is connected in correspondence with an output terminal PAD to an external load LOAD. The output stage 1 also has an enable terminal 6 (FIG. 6A), which receives a general enable signal EN.

In particular, the output stage 1 comprises a pre-buffer 10 connected to the input terminal DATA and having a first output terminal 7 and a second output terminal 8 suitable for respectively supplying a first control signal Gate_P and a second control signal Gate_N for driving an output buffer 20. The output buffer 20 comprises at least one first final transistor Pfin, in particular of the P_MOS type, having a control or gate terminal g_p connected to the first output terminal 7 of the pre-buffer 10, and having a first conduction terminal s_p, in particular a source one, connected to the supply terminal 2 and a second conduction terminal d_p, in particular a drain one, connected to the output terminal PAD and then to the load Load.

Symmetrically, the output buffer 20 comprises a second final transistor Nfin, in particular of the N_MOS type, having a control or gate terminal g_n connected to the second output terminal 8 of the pre-buffer 10, and having a first conduction terminal s_n, in particular a source one, connected to the reference terminal 3 and a second conduction terminal d_n, in particular a drain one, connected to the output terminal PAD. As it can be noted, the output stage 1 is substantially symmetrical with respect to an intermediate line B-B', which connects in particular the input terminal DATA and the output terminal PAD.

Then, hereafter a section of the output stage 1 may be substantially described, in particular the one above the intermediate line B-B', which fundamentally allows a switch according to a pull-up mode, which substantially provides a conduction of the upper section and a switch-off of the lower section. The description of the lower section of the output stage, brought in conduction during a dual switch, being logically deducible.

Once enabled by the general enable signal EN, the output stage 1 transfers the input signal IN# to the load Load activating, in a substantially alternated way, a first section (FIG. 6) positioned above the line B-B' or a second section, symmetrical and opposed (FIG. 6) positioned below the line B-B'. In particular, this alternated activation occurs in correspondence with a switch of the input signal IN#: from a low logic value, or 0 logic, to a high logic value, or 1 logic, or vice versa.

In its most general form, the output stage further comprises at least one first tracking circuit 30, inserted between the supply terminal 2 and the first output terminal 7 of the pre-buffer 10. Advantageously, the first tracking circuit 30 comprises a first capacitor C1 inserted between the supply terminal 2 and a first intermediate node 35 which is in turn connected to the first output terminal 7 of the pre-buffer 10 by means of a switch M11 activated by a first activation signal P_UP during at least one transient of the first final transistor Pfin.

Suitably, activation and enable inner signals are generated by a first 50 and a second logic circuit 60 driven by the first and by the second control signal, Gate_N and Gate_N, as well as at least one first 80 and second activation circuit 85 and a first 70 and a second delay circuit 90, suitably driven by the input signal IN# and by the general enable signal EN. More in detail, the pre-buffer 10 comprises a first inverter I1 connected at the input to the input terminal DATA and having an output terminal 5 connected to both a second inverter I2 and to a third inverter I3.

The second inverter I2 comprises a complementary pair of MOS transistors, in particular a first transistor M1, of the p-MOS type, and a second transistor M2, of the n-MOS type, connected, in series to each other, between the supply terminal 2 and the reference terminal 3. In particular, the first transistor M1 and the second transistor M2 have respective control terminals, or gates, connected to each other and to the output terminal 5 of the first inverter I1, first conduction terminals being respectively connected to the supply terminal 2 and to the reference terminal 3 and second conduction terminals connected to each other to form the first output terminal 7 of the pre-buffer 10.

Advantageously, the second inverter I2 further comprises a first enable circuit 4 inserted between the second transistor M2 and the reference terminal 3. Suitably, the first enable circuit 4 comprises a first enable terminal c1 and a second enable terminal c2, which respectively receive a first enable signal EN_P_UP and a second enable signal EN_P_PAR.

In particular, according to the present embodiment, the first enable circuit 4 further comprises a third transistor M3 and a fourth transistor M4, both of the n-Mos type, connected in parallel to each other and having respective first conduction terminals connected to the reference terminal 3 and respective second conduction terminals to the first conduction terminal of the second transistor M2. Moreover, the third transistor M3 has a control terminal or gate connected to the first enable terminal c1 while the fourth transistor M4 has a control terminal or gate connected to the second enable terminal c2.

Similarly and symmetrically, the third inverter I3 comprises a complementary pair of transistors, in particular a fifth M5 and a sixth transistor M6, of the p-MOS type, connected in series to each other and having first conduction terminals respectively connected to the reference terminal 3 and the supply terminal 2, second conduction terminals connected to each other to form the second output terminal 8, as well as control terminals or gates connected to each other and connected to the output terminal 5 of the first inverter I1.

Moreover, the third inverter I3 further comprises a second enable circuit 14 inserted between the supply terminal 2 and the sixth transistor M6 and having respective third c3 and fourth enable terminal c4, which respectively receive a third enable signal EN_N_UP and a fourth enable signal EN_P_PAR. Suitably, the second enable circuit 14 comprises a seventh M7 and en eighth transistor M8, both of the p-MOS type, connected in parallel to each other and having respective first conduction terminals connected to the supply terminal 2 and second conduction terminals connected to the first conduction terminal of the sixth transistor M6. Moreover, the seventh transistor M7 has a control terminal or gate connected to the third enable terminal c3 while the eighth transistor M8 has a control terminal or gate connected to the fourth enable terminal c4.

Figure 6A:
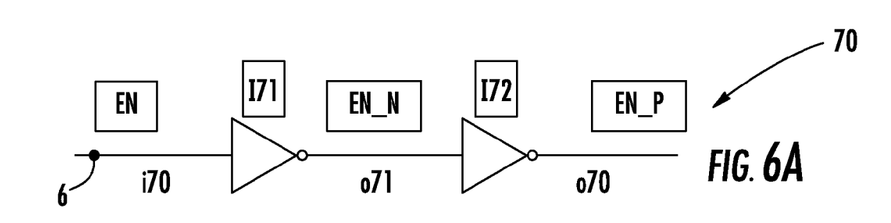
Figure 6B:
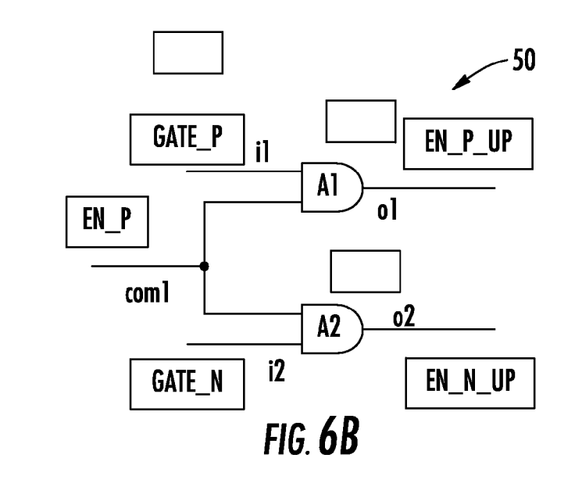

Advantageously, the first enable signal EN_P_UP and the third enable signal EN_N_UP are supplied by a first logic circuit 50, shown in FIG. 6B, which comprises a first and a second input terminal, i1 and i2, and a first and a second output terminal, respectively, o1 and o2, as well as a control terminal com1. Suitably, the first logic circuit 50 is realized in such a way as to generate the first enable signal EN_P_UP and the third enable signal EN_N_UP which meet the following relations:

$$EN\_P\_UP = GATE\_P \quad (1)$$

$$EN\_N\_UP = GATE\_N \quad (2)$$

In the present embodiment, the first logic circuit 50 comprises a first logic gate A1 and a second logic gate A2, in particular both the gates are of the AND type. Advantageously then, the first logic gate A1 receives from the first input terminal i1 the first control signal Gate_P while the second logic gate A2 receives from the second input terminal i2 the second control signal Gate_N, these gates being enabled by the same control terminal com1 which receives a first inner enable signal EN_P.

The first delayed enable signal EN_P is supplied by an output terminal o70 of a first delay circuit 70 (FIG. 6A). Advantageously, the first delay circuit 70 is a circuit having an input terminal i70 connected to the enable terminal 6 of the pre-buffer 10 which receives the general enable signal EN and the output terminal o70 which supplies the first inner enable signal EN_P, delayed with respect to the general enable signal EN.

Moreover, the first delay circuit 70 comprises an intermediate terminal o71, which supplies a second inner enable signal EN_N, opposed to the general enable signal EN according to the following relation:

$$EN = EN\_P = NOT(EN\_N) \quad (3)$$

Suitably, the first delay circuit 70 comprises a first inverter I71 and a second inverter I72 connected in series to each other between the input terminal i70 and the output terminal o70. The intermediate terminal o71 is the output terminal of the first inverter I71.

The second inverter I72 receives the second inner enable signal EN_N from the intermediate terminal and supplies the output terminal o70 with the first inner enable signal EN_P which substantially corresponds to the general enable signal EN of the pre-buffer 10 and is delayed in time with respect to this one.

Advantageously, according to the relations (1) and (2) the first enable signal EN_P_UP as well as the third enable signal EN_N_UP at the output of the first logic circuit 50 follow the progress of the first control signal Gate_P and of the second control signal Gate_N at the output of the pre-buffer 10 by means of an enabling supplied by the first inner enable signal EN_P. Suitably, the second enable signal EN_P_PAR of the first enable circuit 4 and the fourth enable signal EN_N_PAR of the second enable circuit 14 are supplied by a second logic circuit 60, shown in FIG. 6C, which comprises a first and a second input terminal i3 and i4, and a first and a second output terminal o3 and o4, as well as a control terminal com2.

Figure 6C:
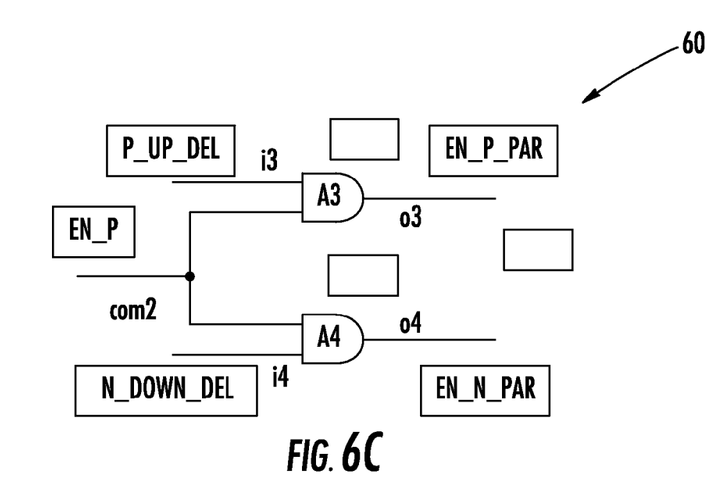

Advantageously, the second logic circuit 60 is realized in such a way that the second enable signal EN_P_PAR and the fourth enable signal EN_N PAR meet the following relations:

$$EN\_P\_PAR = P\_UP\_DEL \quad (4)$$

$$EN\_N\_PAR = N\_DOWN\_DEL \quad (5)$$

In the present embodiment, the second logic circuit 60 comprises a third logic gate A3 and a fourth logic gate A4, in particular both the gates are of the AND type.

The first input terminal i3 of the third logic gate A3 is connected to an output terminal o80 of a first activation circuit 80, while the second input terminal i4 of the fourth logic gate A4 is connected to an output terminal o85 of a second activation circuit 85. Both the gates A3 and A4 are enabled a same control terminal com1 receiving the first inner enable signal EN_P generated by the first delay circuit 70.

The first activation circuit 80, shown in FIG. 6, is connected to the first output terminal 7 of the pre-buffer 10 by means of an input terminal i80 and comprises three inverters I11, I82 and I83 connected to each other in cascade interposed between the input terminal i80 and the output terminal o80 of the first activation circuit 80.

In particular, the first inverter I81 is connected to the input terminal i80 and supplies an intermediate output terminal o81 with a first activation signal P_UP which is substantially opposed to the first control signal Gate_P present at the input terminal i80. The third inverter I83 supplies the output terminal i80, of the first activation circuit 80, with a first delayed activation signal P_UP_DEL, which substantially corresponds to an opposed signal with a delayed switch in time with respect to the first control signal Gate_P.

Similarly, the second activation circuit 85 (FIG. 6) has an input terminal i85 connected to the second output terminal 8 of the pre-buffer 10 and comprises in cascade three inverters, I86, I87 and I88 interposed between the input terminal i85 and the output terminal o85 of the second activation circuit

85. The first inverter I86 receives from the input terminal i85 the second control signal Gate_N and supplies an intermediate terminal o86 with a second activation signal N_DOWN, which is substantially opposed to the second control signal Gate_N. While the third inverter I88 supplies the output terminal o85 of the second activation circuit 85 with a second delayed activation signal N_DOWN_DEL, which is substantially opposed and delayed in time with respect to the second control signal Gate_N.

Advantageously, then, the second enable signal EN_P_PAR as well as the fourth enable signal EN_N_PAR present at the output of the second logic circuit 60 substantially correspond to the first delayed activation signal P_UP_DEL and to the second delayed activation signal N_DOWN_DEL enabled by the first inner enable signal EN_P. It is good to highlight that the second enable signal EN_P_PAR as well as the fourth enable signal EN_N_PAR substantially show an opposed temporal progress delayed in time with respect to the first Gate_N and to the second control signal Gate_N present at the first 7 and at the second output terminal 8 of the pre-buffer 10.

Advantageously, the first logic circuit 50 and the second logic circuit 60 enable in a substantially alternated way the third transistor M3 and the fourth transistor M4 of the first enable circuit 4. Moreover, the second logic circuit 60, due to the first activation circuit 80, enables the fourth transistor M4 of the first enable circuit 4 with a delay which is function of the dimensioning of the first activation circuit 80 itself.

Similarly, the seventh M7 and the eighth M8 transistor of the second enable circuit 14 are alternatively enabled by the first 50 and by the second logic circuit 60 and the eighth transistor M8 is enabled with a delay which is function of the dimensioning of the second activation circuit 85. In other words, the first activation circuit 80 and the second activation circuit 85 can be considered as feedback circuits respectively of the first control signal Gate_P and of the second control signal Gate_N.

Advantageously, the output stage 1 further comprises a first tracking circuit 30 inserted between the supply terminal 2 and the first output terminal 7 of the pre-buffer 10, as well as a second symmetrical tracking circuit 40 inserted between the reference terminal 3 and the second output terminal 8 of the pre-buffer 10. Suitably, the first tracking circuit 30 comprises at least one first capacitor C1 inserted between the supply terminal 2, receiving the first reference voltage Vdd, and a first intermediate node 35 connected to the first output terminal 7 by means of a first switch M11.

Suitably, the first switch M11 comprises a control terminal or gate g11 connected to the intermediate terminal o81 of the first activation circuit 80 and then driven by the first activation signal P_UP. According to the present embodiment, the first switch M11 is a transistor of the n-MOS type and has a first conduction terminal connected to the first output terminal 7 of the pre-buffer 10 and a second conduction terminal connected to the first intermediate node 35.

Further, the first tracking circuit 30 comprises a second transistor M12 of the n_MOS type, which has a first conduction terminal connected to the reference terminal 3 and a second conduction terminal connected to the first intermediate node 35, which is maintained at the second reference voltage Gnd. Moreover, the second transistor M12 has a control terminal or gate g12 connected to an output terminal o90 of a second delay circuit 90, schematically shown in FIG. 6D, which supplies an output terminal o90 thereof with an input delayed signal IN#_DEL.

Figure 6D:
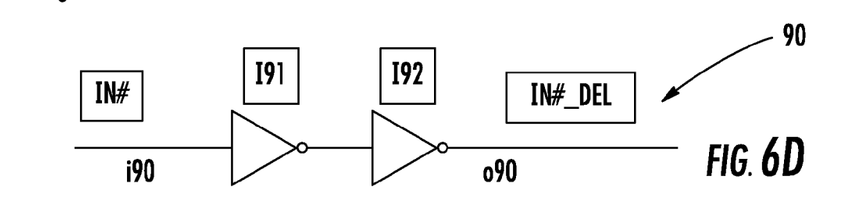

Advantageously, the delay circuit 90 is realized in such a way that the input delayed signal IN#_DEL substantially corresponds to the input signal IN# with respective switches delayed in time determined by the dimensioning of the second delay circuit 90 itself. The signals meet the relation:

$$IN\# = IN\#\_DEL \qquad (6)$$

In the present embodiment, the second delay circuit 90 comprises an input terminal i90 connected to the input terminal DATA of the output stage 1, which receives the input signal IN#, and comprises a first I91 and a second inverter I92 connected in series to each other and suitable for supplying the output terminal o90 with the input delayed signal IN#_DEL.

Similarly, the second tracking circuit 40 comprises at least one second capacitor C2 inserted between the reference terminal 3, maintained at the second reference voltage Gnd, and a second intermediate node 38 connected to the second output terminal 8 of the pre-buffer 10 by means of a second switch M9, which comprises a control terminal or gate g9 suitably connected to the intermediate terminal o86 of the second activation circuit 85.

Suitably, the second switch M9 is driven by the second activation signal N_DOWN. In particular, the second switch M9 is a transistor of the p-MOS type, and has a first conduction terminal connected to the second output terminal 8 of the pre-buffer 10 and a second conduction terminal connected to the second intermediate node 38. Further, the second tracking circuit 40 comprises a second transistor M10, of the p_MOS type, which has a first conduction terminal connected to the second intermediate node 38 and a second conduction terminal connected to the supply terminal 2, as well as a control terminal or gate g10 connected to the output terminal o90 of the second delay circuit 90. Then, the second transistor M10 is driven by the input delayed signal IN#_DEL.

In the example shown in the figure, the transistors of the N type have respective body terminals connected to the second reference terminal, i.e. to the ground Gnd, while the transistors of the p type have respective body terminals connected to the first reference terminal, i.e. to the supply Vdd.

The operation of the output stage 1 is now described. It is considered that the enable signal EN at the enable terminal 6 of the pre-buffer 10 is at a high logic value 1 so as to enable the output stage 1. Let's now analyze the operation of the output stage 1 during a falling transition of the input signal IN# with the passage from a high logic value, associated with the value 1, to a low logic value, associated with the value 0.

Figure 7:
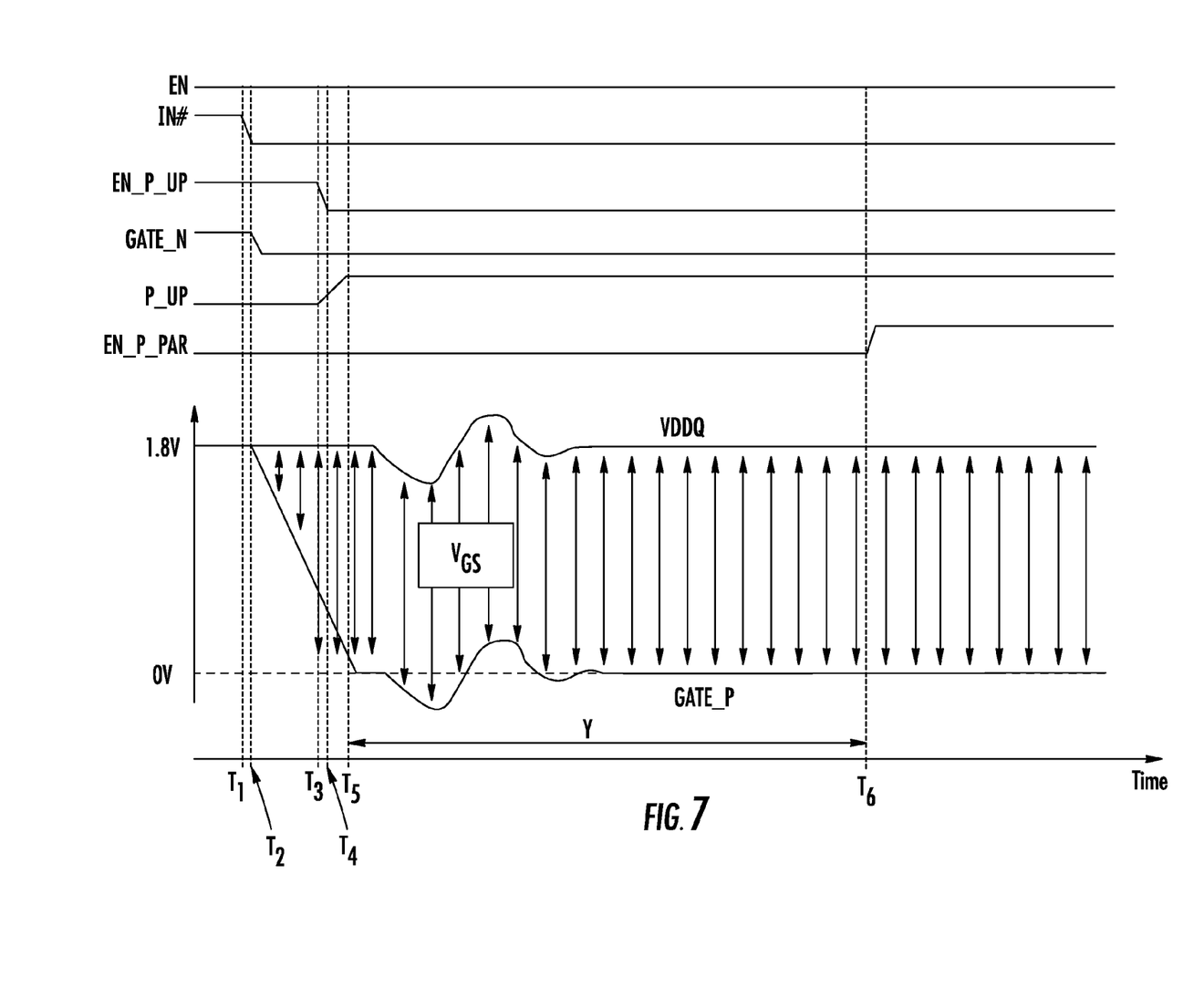
FIG. 7 schematically shows some signals of the stage of FIG. 6 as generated during a transition of an input signal, according to the present invention.

FIG. 7 shows some signals characteristics of the output stage 1, with the respective temporal progresses, generated during this falling transition of the input signal IN#. Prior to a first time T1, in which the falling transition of the input signal IN# starts, the first transistor M1 and the fifth transistor M5 of the pre-buffer 10 conduct. In this way, the first control signal Gate_P and the second control signal Gate_N are at a value 1 and maintain respectively off the first final transistor Pfin of the output buffer 20 and in conduction the second final transistor Nfin.

Moreover, prior to the first time T1, the first capacitor C1 is loaded being connected between the supply terminal 2, which receives the first reference voltage Vdd, and the first intermediate node 35, maintained at the second reference voltage Gnd, the second transistor M12 in conduction being driven by the input delayed signal IN#_DEL having a value 1. The first intermediate node 35 is disconnected from the first output terminal 7 the first switch M11 being off. In fact, the first activation signal P_UP is at a value 0 the first control signal Gate_P being at the value 1.

At the first time T1, the input signal IN# switches reaching, at a second time T2, a value 0. After the switch of the input signal IN#, the signal at the output terminal 5 switches and, at the second time T2, the second transistor M2 and the third transistor M3 start to conduct. In particular, the third transistor M3 remains in conduction as long as the first enable signal EN_P_UP remains at a value 1, i.e. as long as the first control signal Gate_P remains at the value 1.

Substantially, then, at the second time T2, the first Gate_P and the second control signal Gate_N start to switch and advantageously, with switch times different from each other. In particular, with the falling transition of the input signal IN#, the second control signal Gate_N, suitable for switching off the second final transistor Nfin in conduction of the output buffer 20, undergoes a quicker switch with respect to the first control signal Gate_P suitable for bringing in conduction the first final transistor Pfin thanks to a suitable dimensioning of the elements contained in the second and third inverter, 12 and 13.

Moreover, with a rising transition of the input signal IN#, the first control signal Gate_P is switched quicker with respect to the second control signal Gate_N. Advantageously, the pre-buffer 10 and the first 30 and the second tracking circuit 40 are dimensioned in such a way that the first final transistor Pfin starts to conduct, i.e. a voltage difference between the first reference voltage Vdd and the voltage of the first control signal Gate_P reaches a threshold voltage for the first final transistor Pfin, only once the second final transistor Nfin is off.

Moreover, the output stage 1 is dimensioned in such a way that, with a falling transition of the input signal IN#, the second intermediate node 38 is disconnected, by means of the second switch M9, from the second output terminal 8. It is also good to observe that with the falling transition of the input signal IN# and the corresponding falling transition of the second control signal Gate_N, the sixth transistor M6 of the pre-buffer 10 is off and then the second enable circuit 14 does not affect in any way the second control signal Gate_N. In particular, the value of the second control signal Gate_N is independent from the values taken by the third enable signal EN_N_UP and by the fourth enable signal EN_N_PAR.

At the second time T2, the first control signal Gate_P start to switch from the value 1 to the value 0 as long as the third transistor M3 remains in conduction, i.e. as long as the first enable signal EN_P_UP is maintained at a value 1 when the first control signal Gate_P reaches a threshold value of the first gate A1. In the present embodiment, the first enable signal EN_P_UP starts to switch at a third time T3 and reaches the value 0 at a fourth time T4. In this way, the third transistor M3 is feedback driver by the first control signal Gate_P.

Naturally, the third time T3 and the fourth time T4 are function of the dimensioning of the first logic circuit 50 and of the second inverter I2. Moreover, substantially at the third time T3, the first activation signal P_UP starts to switch due to the switch of the first control signal Gate_P. At the fourth time T4 the first enable signal EN_P_UP switches at a value 0 switching off in particular the third transistor M3, while, the fourth transistor M4 is off since it is driver by the second enable signal EN_P_PAR, which remains at a value 0 as long as the third activation signal P_UP_DEL remains at a value 0, i.e. as long as the third inverter I83 is not affected by the switch of the first control signal Gate_P.

Advantageously, the switch-off of the third transistor M3 at the fourth time T4 brings the first output terminal 7 to a state of high impedance, also called tri-state condition, disconnecting in particular the output buffer 20 from the pre-buffer 10. At a fifth time T5, the first activation signal P_UP reaches the value 1 activating the switch M11 and then connecting the first intermediate node 35 of the first tracking circuit 30 to the first output terminal 7 of the pre-buffer 10 and then to the control terminal g_p of the first final transistor Pfin.

In the meantime, the input delayed signal IN#_DEL is switched to a value 0 and the second transistor M12 is off. Advantageously, then, the first control signal Gate_P follows the progress, by means of the first capacitor C1 suitably loaded, of the first supply voltage Vdd present at the supply terminal 2 the first capacitor C1 is connected to.

Then from the fifth time T5, the first control signal Gate_P is maintained at a substantially zero value however following in the meantime the progress of the first reference voltage Vdd due to the first capacitor C1. Advantageously, the first final transistor Pfin has a voltage difference Vgs between the control terminal or gate and the first conduction terminal or source, connected to the supply terminal 2, equal to the first reference voltage Vdd thus allowing to obtain best performances.

At a sixth time T6, subsequent to the fifth time T5, the first control signal Gate_P, which substantially has a value 0, propagates through the first activation circuit 80 and the third activation signal P_UP_DEL switches suitably passing from the value 0 to a value 1. At the sixth time T6 then, also the second enable signal EN_P_PAR switches, passing from a value 0 to a value 1. The second transistor M4 is activated and activates in turn the second transistor M2 forcing to a value 0 the first Gate_P signal of the first output terminal 7.

Suitably, the first activation circuit 80 is dimensioned in such a way that the switch of the third inverter I83, which activates the enable circuit 4, occurs subsequently to a transient Y, i.e. a time interval T6-T5. During which, the first reference voltage Vdd—due to the switch at the output terminal PAD—undergoes a maximum modulation, which could affect negatively the progress of the output stage 1 especially with high frequency switches.

In fact, during the transient Y, the first signal Gate_P, due to the activation of the first tracking circuit 30, follows the progress of the first reference voltage Vdd maintaining the difference of gate-source voltage Vgs of the first final transistor Pfin substantially constant and fundamentally equal to the first reference voltage Vdd. In this way, the first final transistor Pfin improves the characteristics maintaining the current and the voltage at the output terminal PAD constant against any variation of the first reference voltage Vdd.

It is also good to observe that the output stage 1 allows an inner management of the enabling of the circuits being present, such as: the first 50 and the second 60 logic circuit, the first delay circuit 70 as well as the first 80 and the second activation circuit 85. Let's also observe that the inner management is substantially regulated on the basis of the switch of the input signal IN# and on the dimensioning of the circuits themselves.

Figure 8:
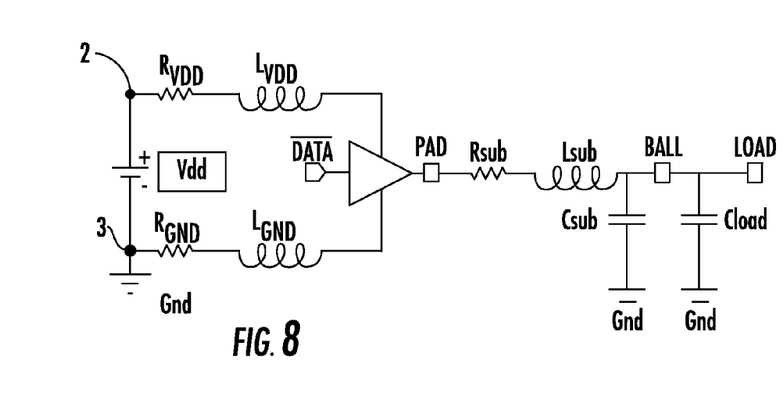
FIG. 8 shows a scheme with concentrated parameters of the output stage of FIG. 6, according to the present invention.

Suitably, some simulations of the output stage 1 have been carried out. FIG. 8 schematically indicates a pattern with concentrated parameters of a simulation circuit used for carrying out comparative tests for evaluating the performance of the output stage with respect to circuits of the prior art. In particular, a first resistance-inductance network Rvdd-Lvdd corresponding to the interconnection line of the supply terminal 2, a second resistance-inductance network Rgnd-Lgnd corresponding to the interconnection line of the reference terminal 3, as well as a third network RLC connected to the output terminal PAD, as already seen in FIG. 4 in connection with the prior art, are considered.

In particular, for the tests carried out, all the three parasite resistances are put at a value of 300 mV; the parasitic inductances Lvdd and Lgnd are substantially put at a value comprised between 5 and 50 nH, the value being high for evaluating the behavior of the output stage 1 under the worst conditions, while the inductance Lsub of the third network RLC is put at a value equal to 10 nH. Further, a first capacitor Csub of the third network RLC is put at a value of 0.5 pF and a second capacitor Cload connected in parallel to the first capacitor Csub and interposed between the load Load and the reference terminal 3 maintained at the reference voltage Gnd, is put at a value of 30 pF.

Figure 9:
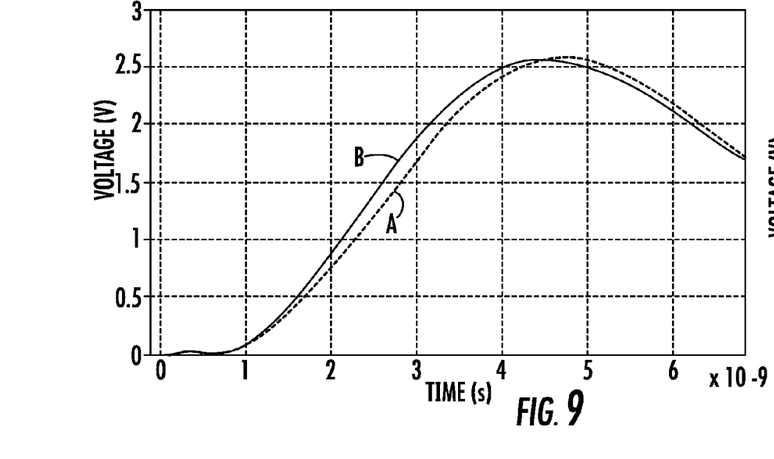
FIGS. 9-11 show a comparison between output signals of the stage of FIG. 6 and of output stages, according to the prior art.

The diagram of FIG. 9 is a comparison between the progress of the voltage at the output terminal PAD of an output stage realized according to the prior art, curve A, and of an output stage realized according to the present invention, curve B. In detail, for the realization of the tests, the parasitic inductances Lvdd and Lgnd equal to 20 nH have been used. As it can be observed, the curve B of the output stage 1 realized according to the present invention has a rise time of the voltage at a node Ball, next to the load Load in FIG. 8, which anticipates the rise time of the curve A by a value equal to 13%.

Figure 10:
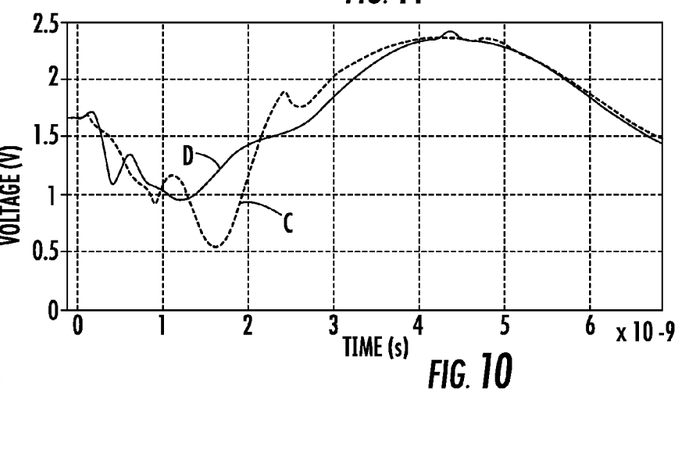

FIG. 10 shows the progress of the voltage at the output terminal PAD for a transition at the input terminal similar to that shown in FIG. 9. In particular, it can be observed how the curve C, which shows the progress of the voltage at the output terminal PAD considering the output stage, during a rising transition of the output voltage, is subject to modulations which correspond to the modulations present in the first reference voltage Vdd, while in the case of a stage according to the prior art, curve D, the modulation is limited.

Figure 11:
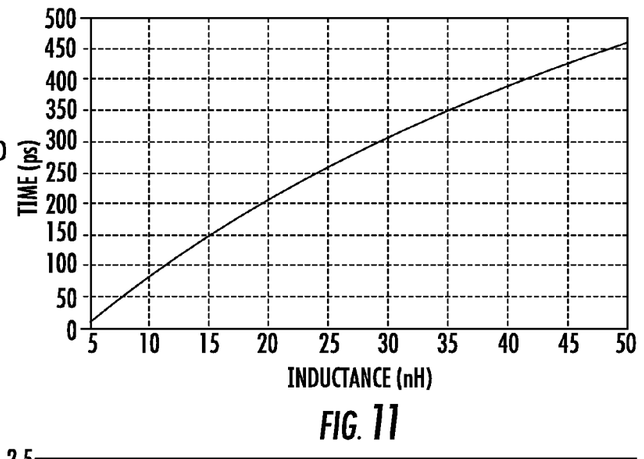

Further, results of other tests are provided and carried out by modifying the values of the parasitic inductances Lvdd and Lgnd, whose results have been shown in FIG. 11. In particular, from the diagram of FIG. 11, wherein the response times of the output stage for reaching a value equal to half of the output voltage have been indicated, it can be observed how the output stage allows for improvement in the response times when the parasitic inductances increase.

A method for driving an output stage 1 is also described. The method comprises further to a switch of the input signal IN# the following steps a first activation step suitable for activating at least one first final transistor Pin of the output buffer 20, generating a corresponding first control signal Gate_P at the first output terminal 7 of the pre-buffer 10, and a second reconstruction step suitable, at least in a transient, for replicating the first reference voltage Vdd present in the supply terminal 2 in the control terminal g_p of the first final transistor Pfin, reconstructing a noise present on the first reference voltage Vdd.

Advantageously, the second reconstruction step further comprises a first sub-step suitable for bringing the first output terminal 7 of the pre-buffer 10 to the tri-state condition, and a second sub-step suitable for connecting the first capacitor C1, of the first tracking circuit 30 to the first output terminal 7 of the pre-buffer 10, activating by means of the first activation signal P_UP the first switch M11. The first sub-step of the second reconstruction step of the method provides to drive the first enable terminal c1 with the first enable signal EN_P_UP, for disabling the first enable circuit 4, and in particular the third transistor M3, the second enable terminal c2 still in the position to disable the fourth transistor M4 due to the switch delay of the second enable signal EN_P_PAR.

In particular, the driving method provides that the first enable signal EN_P_UP is a signal supplied by the first logic circuit 50, corresponding to the first signal Gate_P of the first output terminal 7 of the pre-buffer 10, and provides that the second enable signal EN_P_PAR is a signal supplied by the second logic circuit 60, corresponding to the first activation delayed signal P_UP_DEL at the output of the first activation circuit 80.

The method further comprises a third step suitable for disconnecting the first tracking circuit 30 from the first output terminal 7 of the pre-buffer 10, by means of the switch of the first activation signal P_UP with the switch-off of the first switch M11. Further, the third step provides a switch of the first input delayed signal IN#_DEL, which allows for activation of the second transistor M12 of the first tracking circuit 30, connecting the first intermediate node 35 to the second reference voltage Gnd, thus allowing the loading of the first capacitor C1.

The method further comprises a fourth step which provides a switch of the first activation delayed signal P_UP_DEL, which allows for activation of the second enable signal EN_P_PAR by activating the second enable terminal c2, of the first enable circuit 4, to generate the first signal Gate_P of the first output terminal 7 of the pre-buffer 10 on the basis of the input signal IN#. The method particularly provides switching off of the second final transistor Nfin of the output buffer 20 before proceeding with the first activation step suitable for bringing in conduction the first final transistor Pfin.

The driving method particularly provides that the first activation circuit 80 and the second activation circuit 85 are substantially feedback circuits respectively of the first control signal Gate_P and of the second control signal Gate_N. Further, the method provides that the first delay circuit 70 and the second delay circuit 90 are circuits suitable for delaying, according to the dimensioning of the same, the enable signal EN and the input signal IN# at the output stage 1. An advantage is having realized an output stage that due to the presence of the tracking circuit and to the capacitor contained therein, allows to drive the transistor in conduction or active of the output buffer with a voltage affected by the switches present on the reference voltage the transistor is connected to.

A further considerable advantage is providing the output stage with enable and delay circuits, which allow management of, by means of the inner generation of signals, the operation of the output stage without resorting to external signals. Another advantage is that of having realized an output stage practically exempt from the "power/ground bounce" noise present on the supply lines, i.e. the current supplied is independent from the oscillations of the voltage on the supply lines. Another advantage is that of having realized an output stage that allows for carrying out of switches at the output within shorter times, thereby considerably increasing the operation frequency. A further advantage is the structural simplicity of the architecture provided, as well as the ease of its realization, only comprising transistors and capacitors.

That which is claimed is:

1. An output stage for an electronic circuit between a supply terminal receiving a first reference voltage and a reference terminal being maintained at a second reference voltage, the output stage comprising:

at least one input terminal configured to receive an input signal;

an output terminal to be coupled to an external load;

a pre-buffer coupled to said at least one input terminal and comprising an enable terminal configured to receive a general enable signal, at least one first output terminal configured to supply a first control signal, a first inverter, and at least one second inverter coupled in series with said first inverter between said at least one input terminal and said at least one first output terminal;

said at least one second inverter comprising a first transistor, and a second transistor, said first transistor being coupled in series to said second transistor and being between the supply terminal and the reference terminal;

an output buffer comprising at least one first transistor between the supply terminal and said output terminal, and a control terminal coupled to said at least one first output terminal of said pre-buffer and configured to receive the first control signal;

at least one first tracking circuit between the supply terminal and said at least one first output terminal of said pre-buffer, said at least one first tracking circuit comprising a first intermediate node, a switch configured to be activated by a first activation signal during at least one transient of said at least one first transistor, and a first capacitor between the supply terminal and said first intermediate node, said first intermediate node to be coupled to said at least one first output terminal of said pre-buffer by way of said switch; and a first enable circuit between said second transistor and the reference terminal and configured to bring said at least one first output terminal of said pre-buffer to a tri-state condition.

2. The output stage according to claim 1 further comprising a first logic circuit having an output terminal and at least one first input; wherein said first enable circuit comprises a first enable terminal coupled to said output terminal of said first logic circuit; wherein said first logic circuit receives a first enable signal and said at least one first input receives the first control signal enabled by a first inner enable signal, delayed with respect to the general enable signal, received at a common input terminal and for generating on said at least one first output terminal of said pre-buffer the first enable signal being equal to the first control signal.

3. The output stage according to claim 2 further comprising a first delay circuit having an output terminal and being coupled between said enable terminal of said pre-buffer and said output terminal of said first delay circuit; and wherein said first delay circuit is for supplying said output terminal of said first delay circuit with the first inner enable signal, and also for supplying an intermediate output terminal with a second inner enable signal, the first inner enable signal being based upon a NOT function of the second inner enable signal, the general enable signal being equal to the first inner enable signal.

4. The output stage according to claim 3 further comprising a first activation circuit, and a second logic circuit having an output terminal and at least one first input; wherein said first enable circuit further comprises a second enable terminal coupled to said output terminal of said second logic circuit; and wherein said at least one first input of said second logic circuit receives a first activation delayed signal generated by said first activation circuit and enabled by the first inner enable signal received at a common input terminal and for generating on said at least one first output terminal of said second logic circuit a second enable signal being equal to the first activation delayed signal.

5. The output stage according to claim 4 wherein said first activation circuit comprises an input terminal coupled to said at least one first output terminal of said pre-buffer, an output terminal for supplying the first activation delayed signal, and an intermediate terminal for supplying the first activation signal corresponding to a signal opposed to the first control signal of said pre-buffer; and wherein the first activation delayed signal is a signal opposed to the first control signal and has a delayed switch in time with respect to the first control signal.

6. The output stage according to claim 5 further comprising a second delay circuit comprising an output terminal; and wherein said at least one first tracking circuit further comprises a second transistor comprising a first conduction terminal coupled to the reference terminal, a second conduction terminal coupled to the first intermediate node, and a control terminal coupled to said output terminal of said second delay circuit, said second delay circuit being driven by an input delayed signal.

7. The output stage a according to claim 1 wherein said pre-buffer includes a second output terminal for supplying a second control signal; wherein said output buffer comprises at least one second transistor between the reference terminal and said second output terminal and having a control terminal coupled to said output terminal of said pre-buffer and receiving therefrom the second control signal; and further comprising at least one second tracking circuit between the reference terminal and said second output terminal of said pre-buffer, and a second capacitor between the reference terminal and a second intermediate node being coupled to said second output terminal of said pre-buffer by a switch activated by a second activation signal during at least one transient of said at least one second transistor.

8. An electronic device comprising:
a supply terminal configured to receive a first reference voltage;
a reference terminal configured to be maintained at a second reference voltage; and
an output stage between said supply terminal and said reference terminal and comprising
at least one input terminal configured to receive an input signal,
an output terminal to be coupled to an external load,
a pre-buffer coupled to said at least one input terminal and comprising an enable terminal configured to receive a general enable signal, at least one first output terminal configured to supply a first control signal, a first inverter, and at least one second inverter coupled in series with said first inverter,
said at least one second inverter comprising a first transistor, and a second transistor, said first transistor being coupled in series to said second transistor and being between said supply terminal and said reference terminal,
an output buffer comprising at least one first transistor between the supply terminal and said output terminal, and a control terminal coupled to said at least one first output terminal of said pre-buffer and being configured to receive the first control signal,
at least one first tracking circuit between the supply terminal and said at least one first output terminal of said pre-buffer, said at least one first tracking circuit comprising a first intermediate node, a switch configured to be activated by a first activation signal during at least one transient of said at least one first transistor, and a first capacitor between the supply terminal and said first intermediate node, said first intermediate node to be coupled to said at least one first output terminal of said pre-buffer by way of said switch, and
a first enable circuit between said second transistor and said reference terminal, said first enable circuit being configured to bring said at least one first output terminal of said pre-buffer to a tri-state condition.

9. The electronic device a according to claim 8 wherein said pre-buffer includes a second output terminal for supplying a second control signal; wherein said output buffer comprises at least one second transistor between the reference terminal and said second output terminal and having a control terminal coupled to said output terminal of said pre-buffer and receiving therefrom the second control signal; and wherein said output stage further comprises at least one second tracking circuit between the reference terminal and said second output terminal of said pre-buffer, and a second capacitor between the reference terminal and a second intermediate node being coupled to said second output terminal of said pre-buffer by a switch activated by a second activation signal during at least one transient of said at least one second transistor.

10. A method for driving an output stage for an electronic circuit between a supply terminal receiving a first reference voltage and a reference terminal being maintained at a second reference voltage, the output stage comprising at least one input terminal to receive an input signal, an output terminal to be coupled to an external load, a pre-buffer to be coupled to the at least one input terminal and comprising an enable terminal receiving a general enable signal and at least one first output terminal for supplying a first control signal, an output buffer comprising at least one first transistor between the supply terminal and the output terminal, and having a control terminal coupled to the at least one first output terminal of the pre-buffer for receiving the first control signal, and at least one first tracking circuit between the supply terminal and the at least one first output terminal of the pre-buffer, the at least one first tracking circuit having a first capacitor between the supply terminal and a first intermediate node, the first intermediate node to be coupled to the at least one first output terminal of the pre-buffer by a switch activated by a first activation signal, the method comprising:
  activating the at least one first transistor of the output buffer to generate the corresponding first control signal on the at least one first output terminal of the pre-buffer; and
  replicating, at least in a transient, the first reference voltage from the supply terminal on the control terminal of the at least one first transistor by at least
    bringing the at least one first output terminal of the pre-buffer to a tri-state condition,
    coupling a first capacitor of the at least one first tracking circuit to the at least one first output terminal of the pre-buffer, and
    generating the first activation signal using at least one first switch.

11. The method according to claim 10 further comprising disconnecting the at least one first tracking circuit from the at least one first output terminal of the pre-buffer, the disconnecting comprising switching off of the at least one first switch by switching of the first activation signal and an activation of a second transistor of the at least one first tracking circuit by a first input delayed signal supplied by a second delayed circuit.

12. The method according to claim 11 further comprising activating a first activation circuit of the pre-buffer by at least switching of a second enable signal, and generating the first control signal on the basis of the input signal.

13. The method according to claim 12 wherein the bringing comprises generating a first enable signal at an enable terminal of a first enable circuit, the first enable signal being supplied by a first logic circuit and corresponding to the first control signal.

14. The method according to claim 13 wherein the generating of the first enable signal comprises generating the second enable signal at a second enable terminal of the first enable circuit, the second enable signal being supplied by a second logic circuit and corresponding to a first activation delayed signal at the output of the first activation circuit.

15. The method according to claim 10 wherein the output buffer comprises at least one second transistor; and further comprising switching off of the at least one second transistor before the activating.

16. An output stage for an electronic circuit between a supply terminal receiving a first reference voltage and a reference terminal being maintained at a second reference voltage, the output stage comprising:
  at least one input terminal configured to receive an input signal;
  an output terminal to be coupled to an external load;
  a pre-buffer coupled to said at least one input terminal and comprising an enable terminal configured to receive a general enable signal, at least one first output terminal configured to supply a first control signal, and a second output terminal configured to supply a second control signal;
  an output buffer comprising at least one first transistor between the supply terminal and said output terminal, a control terminal coupled to said at least one first output terminal of said pre-buffer and being configured to receive the first control signal, and at least one second transistor between the reference terminal and said second output terminal and having a control terminal coupled to said output terminal of said pre-buffer and being configured to receive therefrom the second control signal;
  at least one first tracking circuit between the supply terminal and said at least one first output terminal of said pre-buffer, said at least one first tracking circuit comprising a first intermediate node, a switch configured to be activated by a first activation signal during at least one transient of said at least one first transistor, and a first capacitor between the supply terminal and said first intermediate node, said first intermediate node to be coupled to said at least one first output terminal of said pre-buffer by way of said switch;
  at least one second tracking circuit between the reference terminal and said second output terminal of said pre-buffer; and
  a second capacitor between the reference terminal and a second intermediate node being coupled to said second output terminal of said pre-buffer by a switch configured to be activated by a second activation signal during at least one transient of said at least one second transistor.

17. A method for driving an output stage for an electronic circuit between a supply terminal receiving a first reference voltage and a reference terminal being maintained at a second reference voltage, the output stage comprising at least one input terminal to receive an input signal, an output terminal to be coupled to an external load, a pre-buffer to be coupled to the at least one input terminal and comprising an enable terminal receiving a general enable signal and at least one first output terminal for supplying a first control signal, an output buffer comprising at least one first transistor between the supply terminal and the output terminal and at least one second transistor, and having a control terminal coupled to the at least one first output terminal of the pre-buffer for receiving the first control signal, and at least one first tracking circuit between the supply terminal and the at least one first output terminal of the pre-buffer, the at least one first tracking circuit having a first capacitor between the supply terminal and a first intermediate node, the first intermediate node to be coupled to the at least one first output terminal of the pre-buffer by a switch activated by a first activation signal, the method comprising:
  activating the at least one first transistor of the output buffer to generate the corresponding first control signal on the at least one first output terminal of the pre-buffer;
  replicating, at least in a transient, the first reference voltage from the supply terminal on the control terminal of the at least one first transistor; and
  switching off of the at least one second transistor before the activating.

* * * * *

UNITED STATES PATENT AND TRADEMARK OFFICE
CERTIFICATE OF CORRECTION

| | | |
|---|---|---|
| PATENT NO. | : 7,750,690 B2 | |
| APPLICATION NO. | : 11/972234 | |
| DATED | : July 6, 2010 | |
| INVENTOR(S) | : Pulici et al. | |

It is certified that error appears in the above-identified patent and that said Letters Patent is hereby corrected as shown below:

Column 1, Line 57    Delete: "I3"
Insert: --I3s--

Column 1, Line 67    Delete: "21"
Insert: --2'--

Column 2, Line 16    Delete: "1'"
Insert: --1'.--

Column 3, Line 21    Delete: "S'"
Insert: --8'--

Column 3, Line 27    Delete: "Nin'"
Insert: --Nfin'--

Column 3, Line 62    Delete: "Csub'"
Insert: --Csub'.--

Column 3, Line 64    Delete: "PAD'r"
Insert: --PAD',--

Column 4, Line 32    Delete: "an"
Insert: --and--

Column 8, Line 32    Delete: "EN_N PAR"
Insert: --EN_N_PAR--

Column 8, Line 50    Delete: "I11"
Insert: --I81--

Signed and Sealed this
First Day of February, 2011

David J. Kappos
*Director of the United States Patent and Trademark Office*

CERTIFICATE OF CORRECTION (continued)
U.S. Pat. No. 7,750,690 B2

| | |
|---|---|
| Column 9, Line 26 | Delete: "the first" <br> Insert: --to the first-- |
| Column 9, Line 27 | Delete: "is function" <br> Insert: --is a function-- |
| Column 9, Line 32 | Delete: "is function" <br> Insert: --is a function-- |
| Column 10, Line 46 | Delete: "signals" <br> Insert: --signal-- |
| Column 11, Line 38 | Delete: "start" <br> Insert: --starts-- |
| Column 11, Line 49 | Delete: "function" <br> Insert: --functions-- |
| Column 15, Line 65 | Delete: "stage a according" <br> Insert: --stage according-- |
| Column 16, Line 53 | Delete: "device a according" <br> Insert: --device according-- |